United States Patent
Garcia

(10) Patent No.: US 12,431,856 B2
(45) Date of Patent: Sep. 30, 2025

(54) TRANSVERSELY-EXCITED FILM BULK ACOUSTIC RESONATOR WITH REDUCED LOSS IN THE APERTURE DIRECTION

(71) Applicant: Murata Manufacturing Co., Ltd., Nagaokakyo (JP)

(72) Inventor: Bryant Garcia, Belmont, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 292 days.

(21) Appl. No.: 17/485,474

(22) Filed: Sep. 26, 2021

(65) Prior Publication Data
US 2022/0149810 A1  May 12, 2022

Related U.S. Application Data

(60) Provisional application No. 63/113,130, filed on Nov. 12, 2020.

(51) Int. Cl.
  H03H 9/02  (2006.01)
  H03H 9/17  (2006.01)
  H03H 9/54  (2006.01)

(52) U.S. Cl.
  CPC .... H03H 9/02228 (2013.01); H03H 9/02015 (2013.01); H03H 9/02157 (2013.01); H03H 9/17 (2013.01); H03H 9/54 (2013.01)

(58) Field of Classification Search
  CPC ...... H03H 9/54; H03H 9/02157; H03H 9/174; H03H 9/175; H03H 9/02228; H03H 9/17; H03H 9/02015; H03H 9/13; H03H 9/173; H03H 9/132
  See application file for complete search history.

(56) References Cited

U.S. PATENT DOCUMENTS

| | | |
|---|---|---|
| 5,446,330 A | 8/1995 | Eda et al. |
| 5,552,655 A | 9/1996 | Stokes et al. |
| 5,726,610 A | 3/1998 | Allen et al. |
| 5,853,601 A | 12/1998 | Krishaswamy |
| 6,377,140 B1 | 4/2002 | Ehara et al. |
| 6,516,503 B1 | 2/2003 | Ikada et al. |
| 6,540,827 B1 | 4/2003 | Levy et al. |
| 6,707,229 B1 | 3/2004 | Martin |
| 6,710,514 B2 | 3/2004 | Ikada et al. |
| 7,345,400 B2 | 3/2008 | Nakao et al. |

(Continued)

FOREIGN PATENT DOCUMENTS

| | | |
|---|---|---|
| WO | 2016017104 | 2/2016 |
| WO | 2018003273 | 1/2018 |

OTHER PUBLICATIONS

The specification of U.S. Appl. No. 63/070,923.*

(Continued)

*Primary Examiner* — Quan Tra
(74) *Attorney, Agent, or Firm* — ArentFox Schiff LLP

(57) ABSTRACT

Acoustic resonator devices and acoustic filter devices. An acoustic resonator includes a piezoelectric plate having front and back surfaces, the back surface facing a substrate. A conductor pattern is formed on the front surface. The conductor pattern includes interleaved interdigital transducer (IDT) fingers connected alternately to first and second busbars, wherein a mark mt of the IDT fingers in margins of an aperture is greater than a mark m of the IDT fingers in a central portion of the aperture.

18 Claims, 8 Drawing Sheets

(56) References Cited

U.S. PATENT DOCUMENTS

| | | | |
|---|---|---|---|
| 7,463,118 B2 | 12/2008 | Jacobsen et al. |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,034 B2 * | 1/2019 | Yoon | H03H 9/02858 |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,461,718 B2 * | 10/2019 | Nakazawa | H03H 9/25 |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 2002/0079986 A1 | 6/2002 | Ruby et al. |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0100164 A1 | 5/2004 | Murata |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0278993 A1 | 11/2011 | Iwamoto |
| 2012/0286900 A1 | 11/2012 | Kadota et al. |
| 2013/0051588 A1 * | 2/2013 | Ruile | H03H 9/1457 |
| | | | 29/25.35 |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2016/0028367 A1 | 1/2016 | Shealy |
| 2016/0182009 A1 | 6/2016 | Bhattacharjee |
| 2017/0063332 A1 | 3/2017 | Gilbert et al. |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0278227 A1 | 9/2018 | Hurwitz |
| 2019/0068159 A1 * | 2/2019 | McHugh | H03H 9/02992 |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin et al. |
| 2019/0348966 A1 | 11/2019 | Campanella-Pineda |
| 2019/0386636 A1 | 12/2019 | Plesski et al. |
| 2020/0036357 A1 | 1/2020 | Mimura |
| 2020/0235719 A1 | 7/2020 | Yantchev et al. |
| 2020/0252045 A1 * | 8/2020 | Solal | H03H 9/1457 |
| 2020/0350891 A1 | 11/2020 | Turner |
| 2021/0013859 A1 | 1/2021 | Turner et al. |
| 2022/0060165 A1 * | 2/2022 | Moulard | H03H 9/54 |
| 2023/0198495 A1 * | 6/2023 | Ouchi | H03H 9/02015 |
| | | | 310/313 A |
| 2023/0308072 A1 * | 9/2023 | Yamane | H03H 9/173 |
| | | | 310/365 |

OTHER PUBLICATIONS

The specification of U.S. Appl. No. 63/070,923 in Japanese.*
Buchanan "Ceramic Materials for Electronics" 3rd Edition, first published in 2004 by Marcel Dekker, Inc. pp. 496 (Year 2004). 00 Jan. 2004.
Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) 00 Jan. 2015.
Zou, Jie "High-Performance Aluminum Nitride Lamb Wave Resonators for RF Front-End Technology" University of California, Berkeley, Summer 2015, pp. 63 (Year 2015) 00 Jan. 2015.
Santosh, G. , Surface acoustic wave devices on silicon using patterned and thin film ZnO, Ph.D. thesis, Feb. 2016, Indian Institute of technology Guwahati, Assam, India Feb. 2016.
Merriam Webster, dictionary meaning of the word "diaphragm", since 1828, Merriam Webster (Year: 1828) 1828.

(56) References Cited

OTHER PUBLICATIONS

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.
Safari et al. "Piezoelectric for Transducer Applications" published by Elsevier Science Ltd., pp. 4 (Year: 2000). 2020.
Moussa et al. Review on Triggered Liposomal Drug Delivery with a Focus on Ultrasound 2015, Bentham Science Publishers, pp. 16 (Year 2005) 2005.
Acoustic Properties of Solids ONDA Corporation 592 Weddell Drive, Sunnyvale, CA 94089, Apr. 11, 2003, pp. 5 (Year 2003). 2003.
Bahreyni, B. Fabrication and Design of Resonant Microdevices Andrew William, Inc. 2018, NY (Year 2008). 2008.
Material Properties of Tibtech Innovations, © 2018 TIBTECH Innovations (Year 2018). 2018.
USPTO/ISA, International Search Report and Written Opinion for PCT Application No. PCT/US2020/45654 dated Oct. 29, 2020.
T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
G. Manohar, "Investigation of Various Surface Acoustic Wave Design Configurations for Improved Sensitivity." Doctoral dissertation, University of South Florida, USA, Jan. 2012, 7 pages.
Ekeom, D. & Dubus, Bertrand & Volatier, A . . . (2006). Solidly mounted resonator (SMR) FEM-BEM simulation. 1474-1477. 10.1109/ULTSYM.2006.371.
Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.
Naumenko et al., "Optimal orientations of Lithium Niobate for resonator SAW filters", 2003 IEEE Ultrasonics Symposium—pp. 2110-2113. (Year: 2003).
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Rodriguez-Madrid et al., "Super-High-Frequency SAW Resonators on AIN/Diamond", IEEE Electron Device Letters, vol. 33, No. 4, Apr. 2012, pp. 495-497. Year: 2012) 2012.
A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
USPTO/ISA, International Search Report and Written Opinion for PCT Application No. PCT/US2021/024824 dated Jul. 27, 2021, 9 total pages.

\* cited by examiner

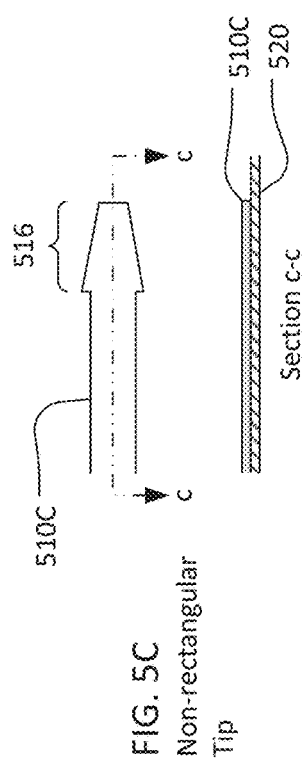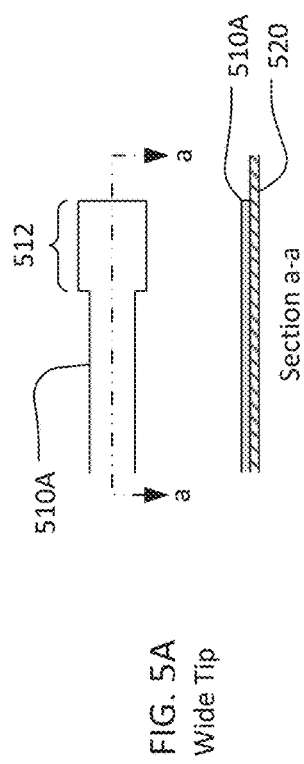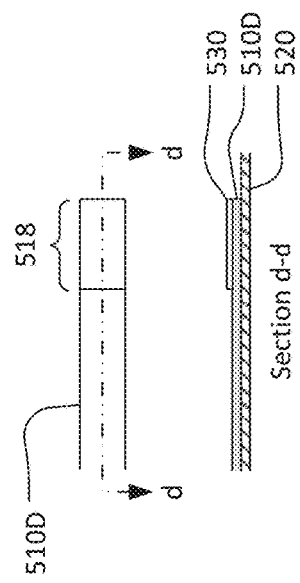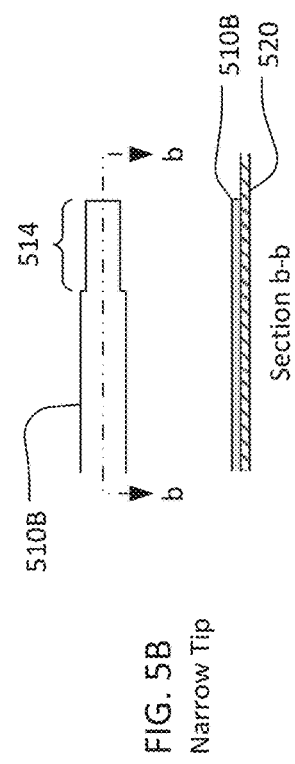

TRANSVERSELY-EXCITED FILM BULK ACOUSTIC RESONATOR WITH REDUCED LOSS IN THE APERTURE DIRECTION

RELATED APPLICATION INFORMATION

This patent claims priority from provisional patent application 63/113,130, filed Nov. 12, 2020, entitled REDUCTION OF RESONATOR LOSS IN THE APERTURE DIRECTION, the entire content of which is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz. Matrix XBAR filters are also suited for frequencies between 1 GHz and 3 GHz.

DESCRIPTION OF THE DRAWINGS

FIG. 5A, FIG. 5B, FIG. 5C, and FIG. 5D each contain a plan view and a cross-sectional view of a single interdigital transducer (IDT) finger.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
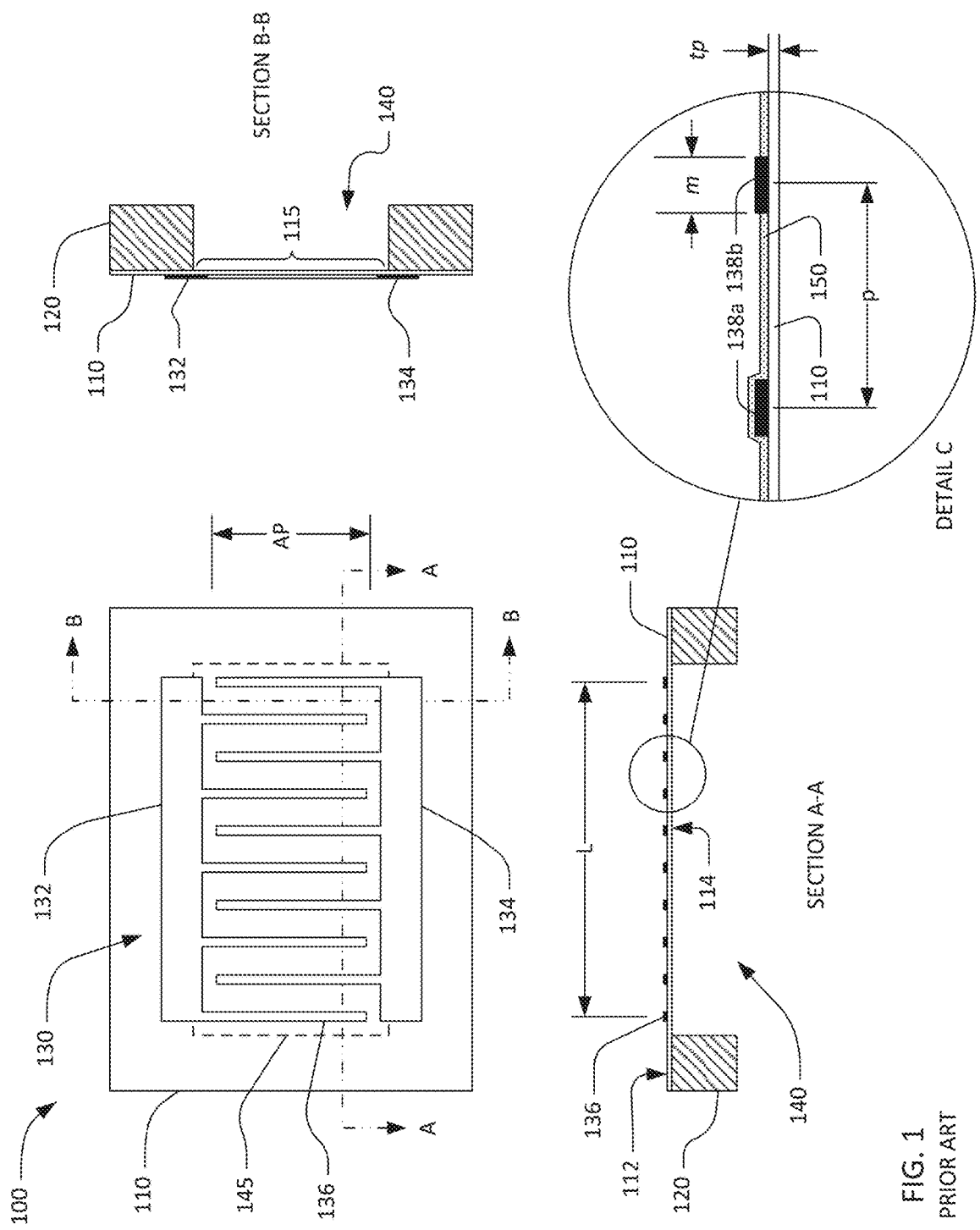
FIG. 1 includes a schematic plan view, two schematic cross-sectional views, and a detail view of a transversely-excited film bulk acoustic resonator (XBAR).

FIG. 1 shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The direction parallel to the IDT fingers will be referred to herein as the "aperture direction". The center-to-center distance L between the outermost fingers of the IDT 130 is the "length" of the IDT. The direction perpendicular to the IDT fingers will be referred to herein as the "length direction."

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

Referring to the detailed cross-sectional view (Detail C), a front-side dielectric layer 150 may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138b)

or may be deposited as a blanket layer such that the dielectric layer is formed both between and over the IDT fingers (e.g. IDT finger 138a). The front-side dielectric layer 150 may be a non-piezoelectric dielectric material, such as silicon dioxide or silicon nitride. The thickness of the front side dielectric layer is typically less than or equal to the thickness of the piezoelectric plate. The front-side dielectric layer 150 may be formed of multiple layers of two or more materials. While the IDT fingers 138a, 138b are shown with rectangular cross-section shapes, other shapes are possible including trapezoidal.

The IDT fingers 138a and 138b may be aluminum, an aluminum alloy, copper, a copper alloy, beryllium, gold, tungsten, molybdenum or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars 132, 134 of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers.

Figure 2:
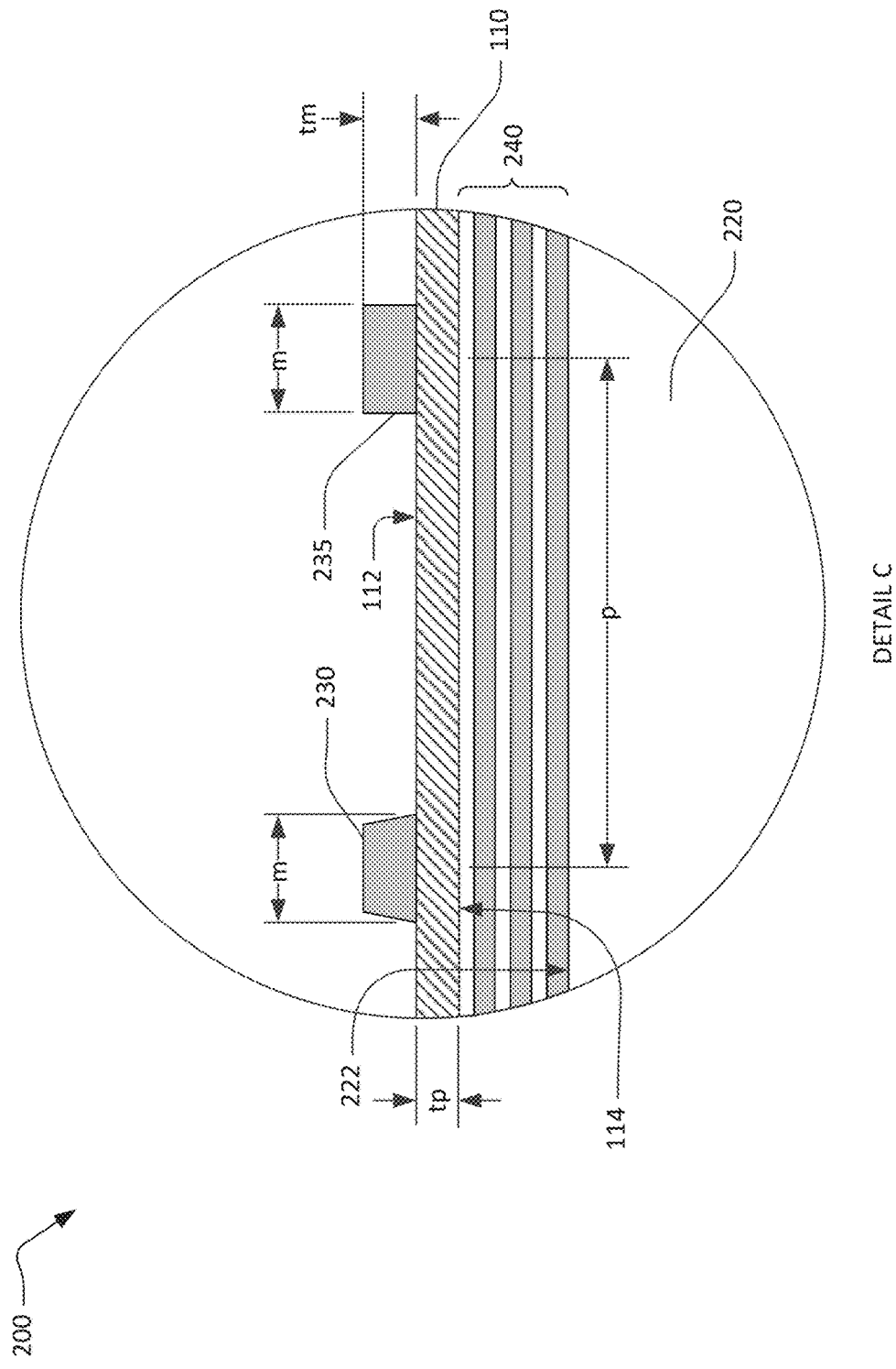
FIG. 2 is a schematic cross-sectional view of a solidly-mounted XBAR.

FIG. 2 shows a detailed schematic cross-sectional view of a solidly mounted XBAR (SM XBAR) 200. SM XBARs are first described in U.S. Pat. No. 10,601,392. The SM XBAR 200 includes a piezoelectric plate 110 and an IDT (of which only fingers 230 and 235 are visible). The piezoelectric layer 110 has parallel front and back surfaces 112, 114. Dimension tp is the thickness of the piezoelectric plate 110. The width (or mark) of the IDT fingers 230, 235 is dimension m, thickness of the IDT fingers is dimension tm, and the IDT pitch is dimension p.

In contrast to the XBAR device shown in FIG. 1, the IDT of an SM XBAR is not formed on a diaphragm spanning a cavity in a substrate (120 in FIG. 1). Instead, an acoustic Bragg reflector 240 is between a surface 222 of a substrate 220 and the back surface 114 of the piezoelectric plate 110. The acoustic Bragg reflector 240 is both disposed between and mechanically attached to a surface 222 of the substrate 220 and the back surface 114 of the piezoelectric plate 110. In some circumstances, thin layers of additional materials may be disposed between the acoustic Bragg reflector 240 and the surface 222 of the substrate 220 and/or between the Bragg reflector 240 and the back surface 114 of the piezoelectric plate 110. Such additional material layers may be present, for example, to facilitate bonding the piezoelectric plate 110, the acoustic Bragg reflector 240, and the substrate 220.

The acoustic Bragg reflector 240 includes multiple dielectric layers that alternate between materials having high acoustic impedance and materials have low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. As will be discussed subsequently, the primary acoustic mode in the piezoelectric plate of an XBAR is a shear bulk wave. Each of the layers of the acoustic Bragg reflector 240 has a thickness equal to, or about, one-fourth of the wavelength of a shear bulk wave having the same polarization as the primary acoustic mode at or near a resonance frequency of the SM XBAR 200. Dielectric materials having comparatively low acoustic impedance include silicon dioxide, carbon-containing silicon oxide, and certain plastics such as cross-linked polyphenylene polymers. Materials having comparatively high acoustic impedance include hafnium oxide, silicon nitride, aluminum nitride, silicon carbide, and diamond. All of the high acoustic impedance layers of the acoustic Bragg reflector 240 are not necessarily the same material, and all of the low acoustic impedance layers are not necessarily the same material. In the example of FIG. 2, the acoustic Bragg reflector 240 has a total of six layers. An acoustic Bragg reflector may have more than, or less than, six layers.

As shown in FIG. 2, IDT finger 230 has a trapezoidal cross-sectional shape and IDT finger 235 has a rectangular cross-sectional shape. The IDT fingers 230, 235 may have some other cross-section, such as T-shaped or stepped. The IDT fingers 230, 235 are shown as single layer structures which may be aluminum or some other metal. IDT fingers may include multiple layers of materials, which may be selected to have different acoustic loss and/or different acoustic impedance. When multiple material layers are used, the cross-sectional shapes of the layers may be different. Further, a thin adhesion layer of another material, such as titanium or chrome, may be formed between the IDT fingers 230, 235 and the piezoelectric plate 110. Although not shown in FIG. 2, some or all IDT fingers may be disposed in grooves or slots extending partially or completely through the piezoelectric plate 110.

An XBAR based on shear acoustic wave resonances can achieve better performance than current state-of-the art surface acoustic wave (SAW), film-bulk-acoustic-resonators (FBAR), and solidly-mounted-resonator bulk-acoustic-wave (SMR BAW) devices. In particular, the piezoelectric coupling for shear wave XBAR resonances can be high (>20%) compared to other acoustic resonators. High piezoelectric coupling enables the design and implementation of microwave and millimeter-wave filters of various types with appreciable bandwidth.

Figure 3B:
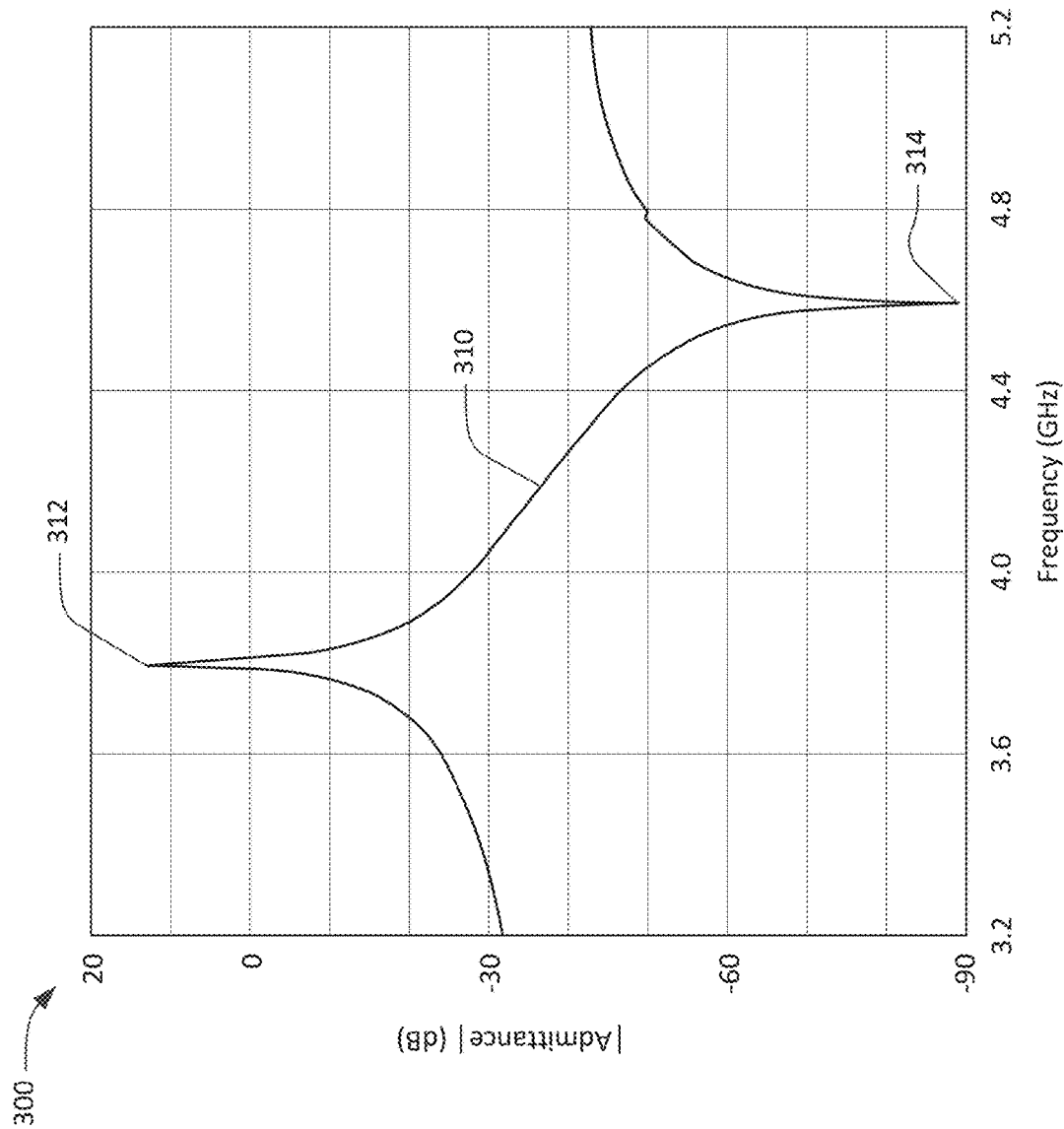
FIG. 3B is a graph of the magnitude of admittance of an ideal acoustic resonator.
Figure 3A:
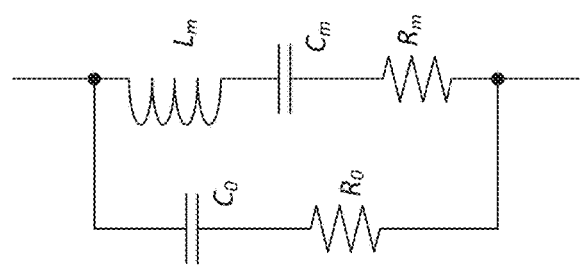
FIG. 3A is an equivalent circuit model of an acoustic resonator.

The basic behavior of acoustic resonators, including XBARs, is commonly described using the Butterworth Van Dyke (BVD) circuit model as shown in FIG. 3A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. The dashed lines show an additional capacitor $C_1$ connected in parallel with the acoustic resonator. The capacitor $C_1$ is not part of the acoustic resonator but may be present in some applications, as will be discussed subsequently. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple passbands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m=R_0=0$), the frequency $F_r$ of the motional resonance is given by $$F_r = \frac{1}{2\pi\sqrt{L_m C_m}} \quad (1)$$

The frequency $F_a$ of the anti-resonance is given by $$F_a = F_r\sqrt{1+\frac{1}{\gamma}} \quad (2)$$

where $\gamma=C_0/C_m$ is dependent on the resonator structure and the type and the orientation of the crystalline axes of the piezoelectric material.

FIG. 3B is a graph 300 of the performance of a theoretical lossless acoustic resonator. Specifically, the solid curve 310 is a plot of the magnitude of admittance of the acoustic resonator as a function of frequency. The acoustic resonator has a resonance 312 at a resonance frequency where the admittance of the resonator approaches infinity. The resonance is due to the series combination of the motional inductance $L_m$ and the motional capacitance $C_m$ in the BVD model of FIG. 3A. The acoustic resonator also exhibits an anti-resonance 314 where the admittance of the resonator approaches zero. The anti-resonance is caused by the combination of the motional inductance $L_m$, the motional capacitance $C_m$, and the static capacitance $C_0$. In a lossless resonator ($R_m=R_0=0$), the frequency $F_r$ of the resonance is given by $$F_r = \frac{1}{2\pi\sqrt{L_m C_m}} \quad (1)$$

The frequency $F_a$ of the anti-resonance is given by $$F_a = F_r\sqrt{1+\frac{1}{\gamma}} \quad (2)$$

In over-simplified terms, the lossless acoustic resonator can be considered a short circuit at the resonance frequency 312 and an open circuit at the anti-resonance frequency 314. The resonance and anti-resonance frequencies in FIG. 3B are representative, and an acoustic resonator may be designed for other frequencies.

Figure 4:
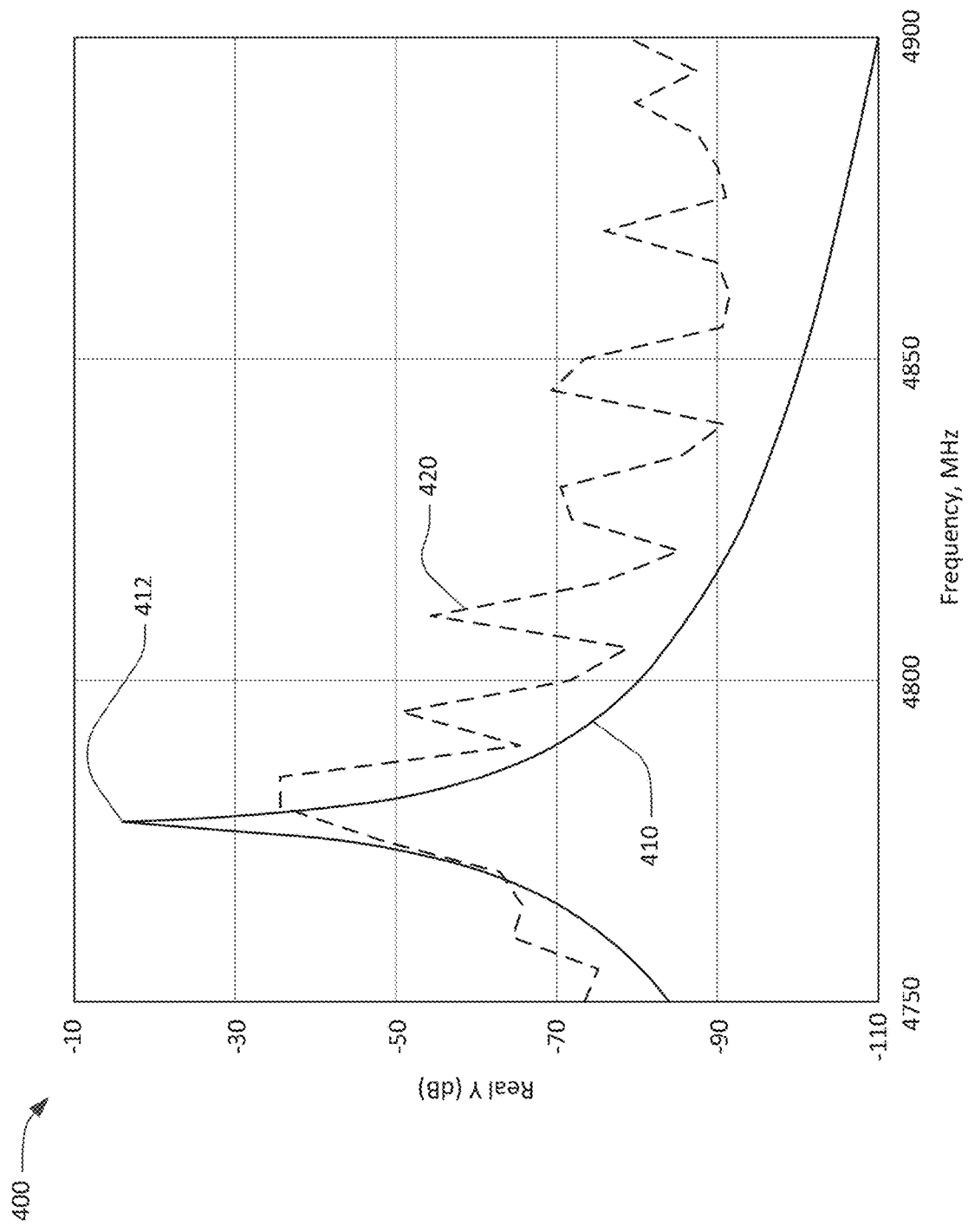
FIG. 4 is a graph comparing the real components of admittance of an XBAR modeled using a two-dimensional (2D) simulation technique and a three-dimensional (3D) simulation technique.

FIG. 4 shows a graph 400 comparing the admittances of a hypothetical XBAR device modeled using a two-dimensional (2D) simulation technique and a three-dimensional (3D) simulation technique. Specifically, the solid curve 410 is a plot of the real component of admittance as a function of frequency for the hypothetical XBAR device determined using the 2D simulation technique. The XBAR device includes a Z-cut lithium niobate piezoelectric plate with a thickness of 0.390 um. The IDT pitch is 4.3 um, and the IDT finger width is 0.993 um. The IDT mark/pitch ratio is 0.23. The IDT is predominantly aluminum with a total thickness of 0.535 um. The gap between the ends of the IDT fingers and the adjacent busbar is 5.0 um. The frequency range of the graph 400 includes the admittance maximum 412 at the resonance frequency of the XBAR device. In over-simplified terms, the 2D simulation technique basically assumes the IDT fingers of the XBAR extend infinitely in both directions perpendicular to the 2D plane being simulated. The admittance is then calculated per unit XBAR width. The 2D simulation technique does not model any spurious modes or other losses that may occur at the ends of finite IDT fingers.

The dashed line 420 is a plot of the real component of admittance for a similar hypothetical XBAR device modeled using a 3D simulation technique. The 3D simulation technique simulates the XBAR with IDT fingers having a defined finite length. The 3D simulation includes spurious modes and other loss mechanism between the ends of the IDT fingers and adjacent busbars. The differences between the solid curve 410 and the dashed curve 420 are primarily due to acoustic losses at the ends of the IDT fingers.

Losses at the ends of IDT fingers also occur in some surface acoustic wave resonators, such as temperature-compensated surface acoustic wave (TCSAW) resonators. Such losses can be minimized by proving thicker metal portions at the ends of the IDT fingers. Such thicker metal portions, commonly referred to as "piston masses", reduce the velocity of the surface acoustic wave at the edges of the device aperture, which helps contain the acoustic energy.

XBAR devices are substantially different from TCSAW devices. In particular, an XBAR is a bulk acoustic wave resonator in which the direction of acoustic energy flow is substantially perpendicular to the surface of the piezoelectric plate. The direction of acoustic energy flow in a TCSAW device is across the surface substantially normal to the IDT fingers. Further, the mark/pitch ratio of the IDT in a TCSAW device is typically 0.5, and the mark/pitch ratio of an XBAR is typically between 0.2 and 0.3. Thus the piston mass structures and dimensions used in TCSAW resonators are not directly applicable to XBAR devices.

FIG. 5A, FIG. 5B, FIG. 5C, and FIG. 5D each contain a plan view and a cross-sectional view of a portion of an IDT finger (510A, 510B, 510C, 510D, respectively). Each IDT finger has a structure at or near the tip of the finger that may at least partially confine the acoustic energy and thus reduce acoustic loss at the ends of the fingers.

Referring first to FIG. 5A, a portion 512 at the tip or end of the IDT finger 510A has a wider mark, or width, than the remainder of the finger. The cross-sectional view a-a shows the IDT finger 510A on a piezoelectric diaphragm 520.

In FIG. 5B, a portion 514 at the tip or end of the IDT finger 510B has a narrower mark, or width, than the remainder of the finger. The cross-sectional view b-b shows the IDT finger 510B on the piezoelectric diaphragm 520.

In FIG. 5C, a portion 516 at the tip or end of the IDT finger 510C has a non-rectangular shape. The cross-sectional view c-c shows the IDT finger 510C on the piezoelectric diaphragm 520.

In FIG. 5D, the mark or width of the IDT fingers is constant over its length. A portion 518 at the tip or end of the IDT finger 510D is thicker than the remainder of the finger. The cross-sectional view d-d shows the IDT finger 510D on the piezoelectric diaphragm 520 and an additional layer 530 over the portion 518. The additional layer 530 may be, for example, metal or dielectric The variations in the widths of the tips of the IDT fingers, as shown in FIG. 5A, FIG. 5B, and FIG. 5C, can be implemented using the same photolithographic processes used to form the IDT fingers with any additional deposition or patterning steps. The increased thickness of the tips of the IDT fingers, as shown in FIG. 5D, requires additional process steps to deposit and pattern the additional layer 530.

Figure 6:
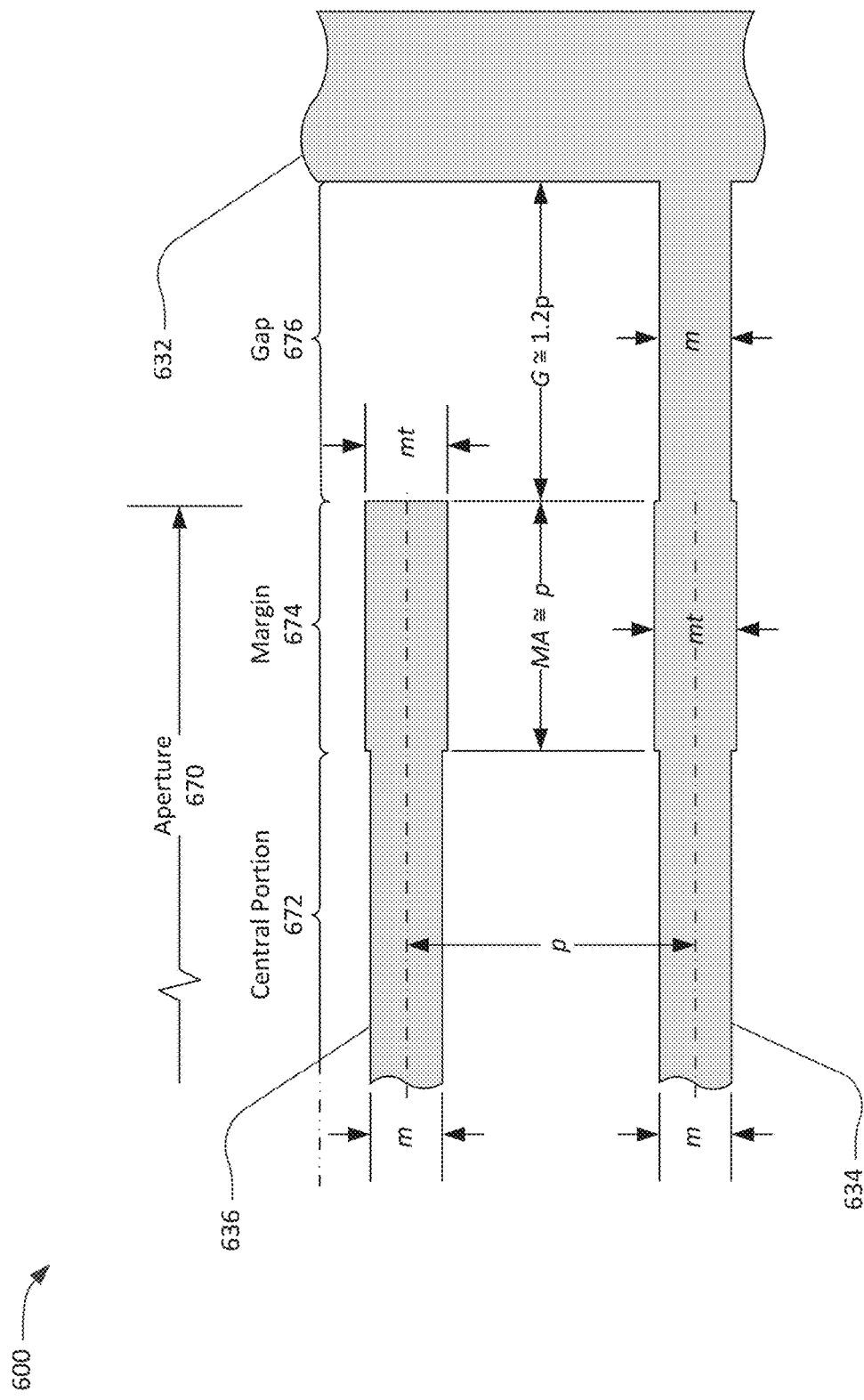
FIG. 6 is a plan view of a portion of an IDT conductor pattern.

FIG. 6 is a plan view of a portion of an IDT conductor pattern. Specifically, FIG. 6 shows portions of two IDT fingers 634, 636 and a busbar 632. IDT finger 634 connects to the busbar 632. IDT finger 636 does not connect to the busbar 632 but does connect to a second busbar (not visible) on the other side of the conductor pattern. As previously defined, the overlapping portions of the IDT fingers 634, 636 define the aperture 670 of the IDT. The aperture is divided into a central portion 672 and two margins, of which only margin 674 is visible. The second margin is disposed at the other ends of the IDT fingers proximate the second busbar.

In this context, the term "margin" has it normal meaning of "the extreme edge of something and the area lying parallel to and immediately adjoining this edge especially when in some way distinguished from the remaining area lying farther in." In this case, the margin 674 and the second margin (not visible) are distinguished from the central portion 672 because the mark mt (conductor width) of the IDT fingers within the margins is wider than the mark m of the IDT fingers in the central portion 672. In this patent, the term "margin" always refers to the margins 674 of the aperture 670, which are distinct from the gap region 676 between the ends of the IDT fingers and the busbars.

In this example, the distance, parallel to the long direction of the IDT fingers, of the margins MA is equal to the pitch p of the IDT fingers. In other cases, the MA may be between 0.5p and 1.5p. In this example, the distance, parallel to the long direction of the IDT fingers, of the gap G is equal to 1.2p of the IDT fingers. In other cases, G may be between 0.5p and 1.5p.

Figure 7:
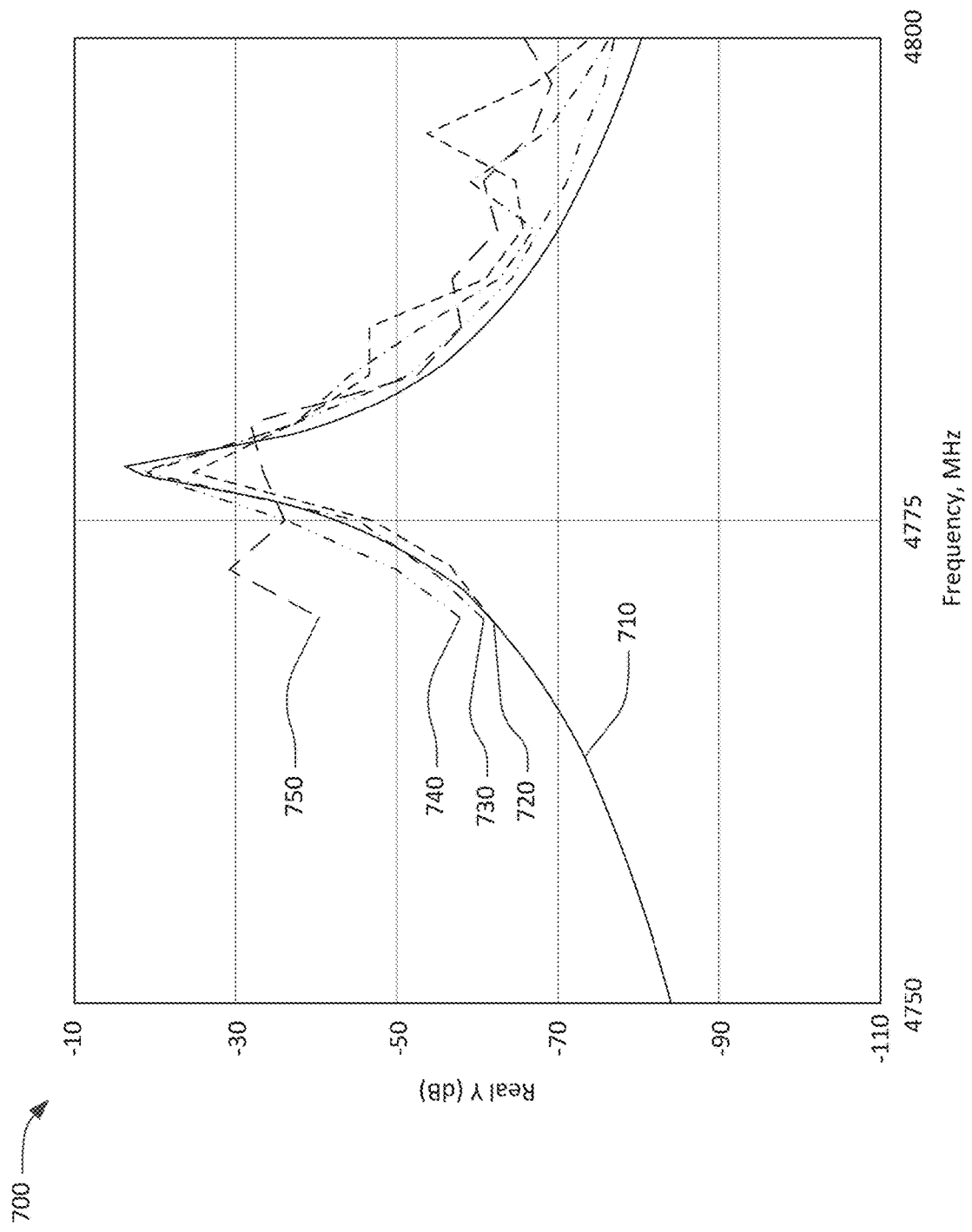
FIG. 7 is a graph comparing the real components of admittance of XBARs with different acoustic confinement structures.

FIG. 7 is a chart 700 comparing four different embodiments of XBARs with increased IDT mark in the margins of the aperture. Specifically, the chart 700 is a plot of the real component of admittance Y of an XBAR similar to that shown in FIG. 6 as a function of frequency for frequencies near the XBAR resonance frequency. The solid curve 710 is a plot of the admittance of the XBAR resulting from two-dimensional simulation. The curve 710, which is a portion of the curve 710 of FIG. 4, does not include losses at the ends of the IDT fingers or wide IDT fingers in the margins of the IDT aperture. The curve 710 is provided as a reference for evaluation of the performance of the XBARs with wide margins.

The dashed curve 720 is a plot of the real component of admittance Y as a function of frequency for an XBAR where the margins of the IDT fingers have a mark/pitch ratio of 0.24 (compared to the mark-pitch ratio of 0.23 for central portions of the IDT fingers). The dot-dash curve 730 is a plot of the real component of admittance Y as a function of frequency for an XBAR where the margins of the IDT fingers have a mark/pitch ratio of 0.25. The dot-dot-dash curve 740 is a plot of the real component of admittance Y as a function of frequency for an XBAR where the margins of the IDT fingers have a mark/pitch ratio of 0.26. The long-dash curve 750 is a plot of the real component of admittance Y as a function of frequency for an XBAR where the margins of the IDT fingers have a mark/pitch ratio of 0.27. Curves 720, 730, 740, and 750 are results of three-dimensional simulation of the XBAR devices. The differences between the curve 710 and the curves 720, 730, 740, and 750 are representative of the acoustic losses at the ends of the IDT fingers. Except for the IDT mark in the IDT margins, the dimensions of the devices are the same as those previously defined as part of the discussion of FIG. 4.

Comparison of FIG. 7 and FIG. 4 shows that the XBAR with a mark/pitch ratio of 0.24 at the margins of the IDT fingers (dashed curve 720) has reduced losses compared to an XBAR with uniform-width IDT fingers (dashed curved 420 in FIG. 4). The XBARs with margin mark/pitch ratios of 0.25 (dot-dash curve 730) and 0.26 (dot-dot-dash curve 740) have substantially lower losses at the ends of the IDT fingers. A margin mark/pitch ratio of 0.27 (long dash curve 750) or greater (not shown but confirmed by simulation) results in increased losses. Thus, the preferred range for the mark of the IDT tip is between 0.24 and 0.26, which is an increase in the margin mark compared to the remainder of the IDT fingers by about 4% and 13%, respectively.

It is expected that the range of IDT margin widths that result in reduced losses will scale with the IDT mark. The preferred width of the IDT margins can be defined by the equation $1.04 \leq mt/m \leq 1.13$, where mnt is the mark of the IDT margins and in is the mark of the central portion of each IDT finger.

Figure 8:
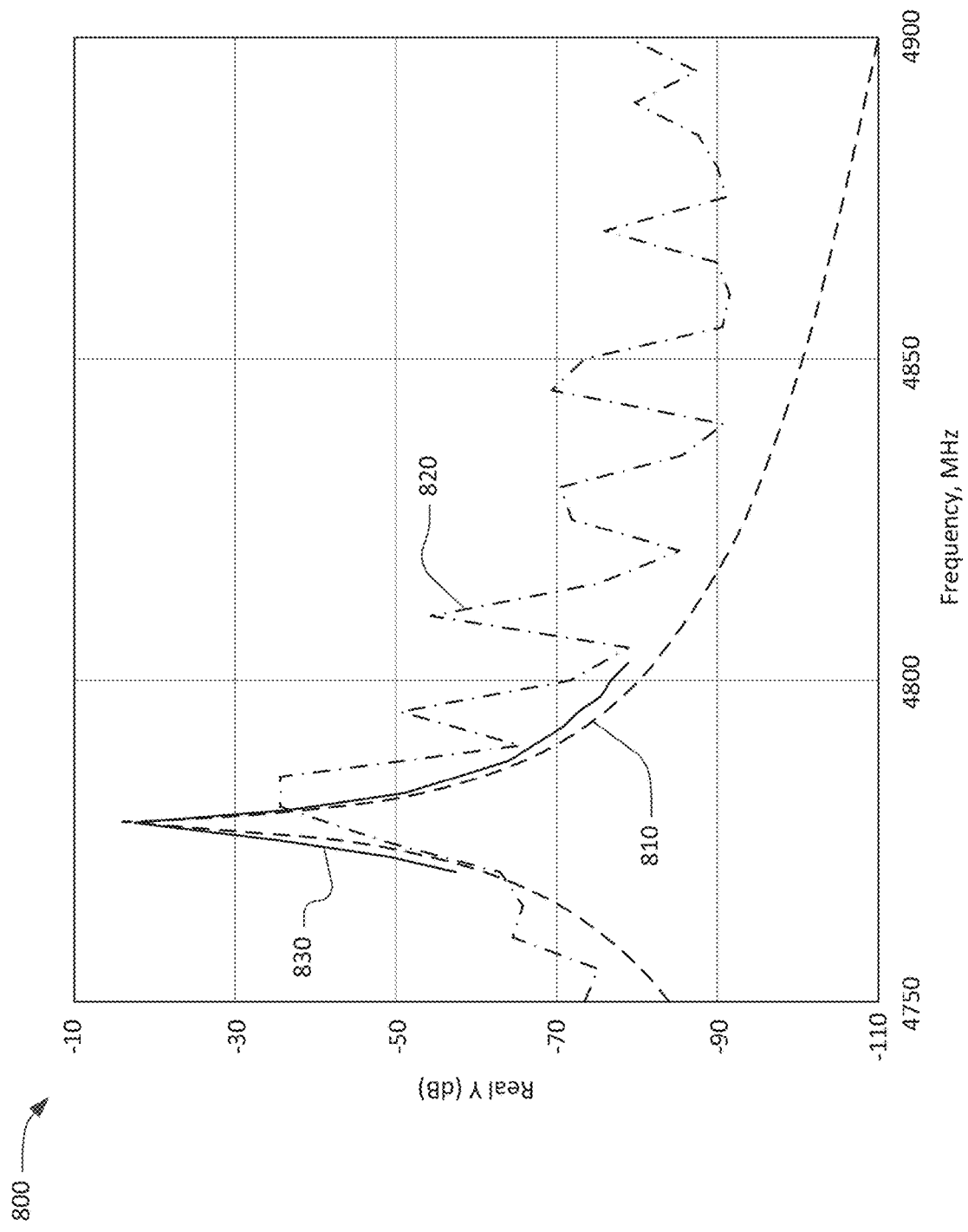
FIG. 8 is a graph comparing the data previously shown in FIG. 4 and the real component of admittance of an XBAR having the IDT conductor pattern shown in FIG. 7 modeled using a 3D simulation technique.

FIG. 8 is a chart 800 illustrating the reduction in loss due to increased IDT mark in the margins of the aperture of an XBAR. Specifically, the chart 800 plots the real component of admittance Y as a function of frequency for frequencies near the XBAR resonance frequency. The dashed curve 810 is a copy of the curve 410 of FIG. 4, which is the real component of admittance of the XBAR as determined by two-dimensional simulation. The dashed curve 810, does not include losses at the ends of the IDT fingers or wide IDT fingers in the margins of the IDT aperture. The mark/pitch ratio is 0.23 over the entire length of the IDT fingers.

The dot-dash curve 820 is a copy of the curve 420 of FIG. 4, which is the real component of admittance of the same XBAR as determined by three-dimensional simulation including losses at the ends of the IDT fingers.

The solid curve 830 is a plot of the real component of admittance for a similar XBAR with a mark/pitch ratio of 0.26 in the margins of the aperture and 0.23 in the central portion of the aperture as determined by three-dimensional simulation. The losses evident in the dot-dash curve 820 have been substantially eliminated.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator, comprising:
   a substrate;
   a piezoelectric layer having a front surface and a back surface facing the substrate; and
   a conductor pattern on the piezoelectric layer and comprising an interleaved interdigital transducer (IDT) having fingers connected alternately to first and second busbars,
   wherein a mark mt of the fingers of the IDT in margins of an aperture is a same mark m of the fingers of the IDT in a central portion of the aperture,
   wherein a thickness of the fingers measured in a direction substantially perpendicular to the mark mt is greater in an area associated with the mark mt and less in an area associated with the mark m,
   wherein a dimension MA of the margins, measured parallel to a length direction of the fingers of the IDT, is greater than or equal to 0.5p and less than or equal to 1.5p, where p is a pitch of the IDT that is measured as a center-to-center spacing between a pair of adjacent fingers of the IDT, and
   wherein a ratio of the mark m to the pitch p is between 0.2 and 0.3.

2. The acoustic resonator of claim 1, wherein a portion of the piezoelectric layer is a diaphragm spanning a cavity in the substrate, and the fingers of the IDT are on the diaphragm.

3. The acoustic resonator of claim 1, further comprising an acoustic Bragg reflector between the substrate and the back surface of the piezoelectric layer.

4. The acoustic resonator of claim 1, wherein the piezoelectric layer is Z-cut lithium niobate.

5. The acoustic resonator of claim 1, wherein a dimension of gaps between ends of the fingers of the IDT and the first and second busbars, respectively, measured parallel to the length direction of the fingers of the IDT, is greater than or equal to 0.5p and less than or equal to 1.5p.

6. An acoustic resonator, comprising:
   a substrate;
   a piezoelectric layer having a front surface and a back surface facing the substrate; and
   a conductor pattern of an interdigital transducer (IDT) on the piezoelectric layer, the conductor pattern comprising a first plurality of fingers extending from a first busbar and a second plurality of fingers extending from a second bus bar, wherein the first and second pluralities of fingers are interleaved,
   wherein an overlap of the first and second pluralities of fingers defines an aperture of the acoustic resonator,
   wherein a mark of the first and second pluralities of fingers is mt in margins of the aperture and m in a central portion of the aperture, and $1.04m \leq mt \leq 1.13m$,
   wherein a dimension MA of the margins, measured parallel to a length direction of the first and second pluralities of fingers, is greater than or equal to 0.5p and less than or equal to 1.5p, where p is a pitch that is measured as a center-to-center spacing between a pair of adjacent fingers of the first and second pluralities of fingers of the IDT, and
   wherein the piezoelectric layer and the IDT are configured such that a radio frequency signal applied to the IDT excites a primary shear acoustic mode in the piezoelectric layer in which acoustic energy propagates along a direction substantially orthogonal to the front and back surfaces of the piezoelectric layer and that is transverse to a lateral direction of an electric field created by the first and second pluralities of fingers.

7. The acoustic resonator of claim 6, wherein:
   a portion of the piezoelectric layer is a diaphragm over a cavity, and
   the first and second pluralities of fingers are on the diaphragm.

8. The acoustic resonator of claim 6, further comprising an acoustic Bragg reflector between the substrate and the back surface of the piezoelectric layer.

9. The acoustic resonator of claim 6, wherein the piezoelectric layer is Z-cut lithium niobate.

10. The acoustic resonator of claim 6, wherein a dimension of gaps between ends of the interleaved fingers of the IDT and the oppose first and second busbars, respectively, measured parallel to the length direction of the interleaved fingers of the IDT, is greater than or equal to 0.5p and less than or equal to 1.5p.

11. A filter device, comprising:
    a piezoelectric layer having front and back surfaces, the back surface facing a substrate; and
    a conductor pattern at the piezoelectric layer and comprising a plurality of interdigital transducers (IDTs), each IDT of the plurality of IDTs comprising interleaved fingers connected alternately to a first busbar and a second busbar,
    wherein, for at least one IDT of the plurality of IDTs, a mark mt of the interleaved fingers in margins of an aperture is the same as a mark m of the interleaved fingers in a central portion of the aperture, and a thickness of the interleaved fingers measured in a direction substantially perpendicular to the mark mt is greater in an area associated with the mark mt than in an area associated with the mark m,
    wherein, for the at least one IDT, a dimension MA of the margins, measured parallel to a length direction of the interleaved fingers, is greater than or equal to 0.5p and less than or equal to 1.5p, where p is a pitch that is measured as a center-to-center spacing between a pair of adjacent fingers of the interleaved fingers of the IDT, and
    wherein a dimension of gaps between ends of the interleaved fingers of the IDT and the first and second busbars, respectively, measured parallel to the length direction of the fingers of the IDT, is greater than or equal to 0.5p and less than or equal to 1.5p.

12. The filter device of claim 11, wherein:
    portions of the piezoelectric layer are one or more diaphragms spanning respective cavities in the substrate, and
    the interleaved fingers of each IDT are on a respective diaphragm.

13. The filter device of claim 11, further comprising an acoustic Bragg reflector between the substrate and the back surface of the piezoelectric layer.

14. The acoustic resonator of claim 2, wherein the IDT is disposed on the front surface of the piezoelectric layer and opposite the cavity in the substrate.

15. The acoustic resonator of claim 7, wherein the IDT is disposed on the front surface of the piezoelectric layer and opposite the cavity in the substrate.

16. The filter device of claim 12, wherein the plurality of IDTs are each disposed on the front surface of the piezoelectric layer.

17. The acoustic resonator of claim 2, wherein the piezoelectric layer and the IDT are configured such that a radio frequency signal applied to the IDT excites a primarily shear acoustic mode in the piezoelectric layer in which acoustic energy propagates along a direction substantially orthogonal to the front and back surfaces of the piezoelectric layer and that is transverse to a lateral direction of an electric field created by the fingers of the IDT.

18. The acoustic resonator of claim 11, wherein the piezoelectric layer and the at least one IDT are configured such that a radio frequency signal applied to the at least one IDT excites a primarily shear acoustic mode in the piezoelectric layer in which acoustic energy propagates along a direction substantially orthogonal to the front and back surfaces of the piezoelectric layer and that is transverse to a lateral direction of an electric field created by the interleaved fingers.

\* \* \* \* \*